United States Patent
Shi et al.

(10) Patent No.: US 8,329,478 B2
(45) Date of Patent: Dec. 11, 2012

(54) MAGNETIC TUNNEL JUNCTION DEVICE AND METHOD FOR MANUFACTURING THE SAME

(75) Inventors: Il-Jae Shi, Seoul (KR); Byoung-Chul Min, Gwangmyeong-si (KR); Kyung-Ho Shin, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 326 days.

(21) Appl. No.: 12/707,047

(22) Filed: Feb. 17, 2010

(65) Prior Publication Data

US 2011/0084347 A1 Apr. 14, 2011

(30) Foreign Application Priority Data

Oct. 8, 2009 (KR) ........................ 10-2009-0095703

(51) Int. Cl.
*H01L 21/00* (2006.01)
(52) U.S. Cl. .............................................................. 438/3
(58) Field of Classification Search ........................ 438/3
See application file for complete search history.

(56) References Cited

U.S. PATENT DOCUMENTS

| | | | |
|---|---|---|---|
| 2009/0061105 A1* | 3/2009 | Fukuzawa et al. | 427/539 |
| 2009/0225587 A1* | 9/2009 | Nagamine et al. | 365/158 |
| 2009/0298200 A1* | 12/2009 | Guo et al. | 438/3 |
| 2010/0028530 A1* | 2/2010 | Parkin | 427/130 |

FOREIGN PATENT DOCUMENTS

| | | |
|---|---|---|
| JP | 2002-158381 | 5/2002 |
| JP | 2003-092444 | 3/2003 |
| JP | 2003-338644 | 11/2003 |
| JP | 2005-203702 | 7/2005 |
| JP | 2007-059879 | 3/2007 |
| KR | 10-1996-0019826 | 6/1996 |
| KR | 10-2001-0100084 | 11/2001 |

OTHER PUBLICATIONS

Shin, IL-Jae; Min, Byoung-Chul; Hong, Jin-Pyo; Shin, Kyung-Ho, TMR characteristics of CoFeB/MgO/CoFeB Junction using in-situ annealing process, pp. 99-100.
I.-J.Shin et al., The effect of in-situ annealing on the magnetotransport properties of exchange-biased CoFeB/<gO/CoFeB tunnel junctions, The International Conference on Magnetism 2009, Karlsruhe, Germany, Jul. 26-31, 2009.

* cited by examiner

*Primary Examiner* — Jae Lee
(74) *Attorney, Agent, or Firm* — Lexyoume IP Meister, PLLC.

(57) ABSTRACT

The present invention relates to a magnetic tunnel junction device and a manufacturing method thereof. The magnetic tunnel junction device includes i) a first magnetic layer having an switchable magnetization direction, ii) a nonmagnetic layer provided on the first magnetic layer, iii) a second magnetic layer provided on the nonmagnetic layer and having a fixed magnetization direction, iv) an oxidation-preventing layer provided on the second magnetic layer, v) a third magnetic layer provided on the oxidation-preventing layer and fixing the magnetization direction of the second magnetic layer through magnetic coupling with the second magnetic layer, and vi) an antiferromagnetic layer provided on the third magnetic layer and fixing a magnetization direction of the third magnetic layer.

9 Claims, 6 Drawing Sheets

MAGNETIC TUNNEL JUNCTION DEVICE AND METHOD FOR MANUFACTURING THE SAME

CROSS-REFERENCE TO RELATED APPLICATION

This application claims priority to and the benefit of Korean Patent Application No. 10-2009-0095703 filed in the Korean Intellectual Property Office on Oct. 8, 2009, the entire contents of which are incorporated herein by reference.

BACKGROUND OF THE INVENTION (a) Field of the Invention

The present invention relates to a magnetic tunnel junction device and a manufacturing method thereof. More particularly, it relates to a magnetic tunnel junction device forming a magnetic tunnel junction structure and improving a characteristic of the structure through annealing, and a manufacturing method thereof.

(b) Description of the Related Art

Recently, various types of memories have been developed. For example, a magnetic random access memory (MRAM), a phase-change random access memory (PRAM), and a resistive random access memory (RRAM) have been developed.

The MRAM uses a magnetic tunnel junction (MJT) element as a data storage element. The magnetic tunnel junction element included in a memory cell is based on ferromagnetic tunnel junction properties. The magnetic tunnel junction element consists of two magnetic layers separated by an insulating layer, and the current flows in the insulating layer through the tunneling mechanism. Here, when the relative magnetization directions of the two magnetic layers are parallel to each other, the magnetic tunnel junction element has low resistance. In contrast, when the two magnetic layers have an antiparallel magnetization configuration, the magnetic tunnel junction element has high resistance. The low resistance and the high resistance indicate digital data, respectively, corresponding to 0 and 1.

The above information disclosed in this Background section is only for the enhancement of understanding of the background of the invention and therefore it may contain information that does not form the prior art that is already known in this country to a person of ordinary skill in the art.

SUMMARY OF THE INVENTION

The present invention has been made in an effort to provide a magnetic tunnel junction device having a large tunnel magnetoresistance (TMR) ratio and a stable exchange coupling. In addition, the present invention provides a manufacturing method of the magnetic tunnel junction device.

A magnetic tunnel junction device according to an exemplary embodiment of the present invention includes: i) a first magnetic layer having an switchable magnetization direction; ii) a nonmagnetic layer provided on the first magnetic layer; iii) a second magnetic layer provided on the nonmagnetic layer and having a fixed magnetization direction; iv) an oxidation-preventing layer provided on the second magnetic layer; v) a third magnetic layer provided on the oxidation-preventing layer and fixing the magnetization direction of the second magnetic layer through magnetic coupling with the second magnetic layer; and vi) an antiferromagnetic layer provided on the third magnetic layer and fixing a magnetization direction of the third magnetic layer.

The oxidation-preventing layer may include an amorphous material. The oxidation-preventing layer may include at least one of materials selected from a group consisting of Ru, Ta, Cr, V, Rh, Ir, Re, Mo, Os, and Pt. The third magnetic layer may include a material selected from a group consisting of Fe, Co, Ni, FeCo, CoNi, and NiFe. The third magnetic layer may include a compound of an element selected from a group consisting of B, Re, Rh, Cr, Cu, Gd, and Tb, and the selected material.

The first and second magnetic layers may include a compound of a material selected from a group consisting of Fe, Co, Ni, FeCo, CoNi, and NiFe, and an element selected from a group consisting of B, Re, Rh, Cr, Cu, Gd, and Tb. At least one magnetic layer selected from a group formed of the first and second magnetic layers may have a body-centered cubic (BCC) lattice structure.

The thickness of at least one magnetic layer selected from a group formed of the first and second magnetic layers may be 1 nm to 5 nm. The nonmagnetic layer may include an insulator or a semiconductor. When the nonmagnetic layer includes the insulator, the insulator may include at least one compound selected from a group consisting of $MgO$, $Al_2O_3$, $HfO_2$, $TiO_2$, $Y_2O_3$, and $Yb_2O_3$. The thickness of the nonmagnetic layer is 0.7 nm to 2 nm. The antiferromagnetic layer may include at least one compound selected from a group consisting of IrMn, PtMn, NiMn, and FeMn.

The magnetic tunnel junction device according to the exemplary embodiment of the present invention may further include a buffer layer provided under the first magnetic layer and a protection layer provided on the antiferromagnetic layer. The buffer layer and the protection layer may include at least one element selected from a group consisting of Au, Ru, Ta, Cu, CuN, Pd, Pt, and diamond-like carbon.

The magnetic tunnel junction device according to the exemplary embodiment of the present invention may further include an exchange coupling layer provided between the oxidation-preventing layer and the third magnetic layer, and inducing magnetic coupling between the second magnetic layer and the third magnetic layer. The exchange coupling layer may include at least one element selected from a group consisting of Ru, Cr, V, Rh, Ir, Re, Mo, Cu, Os, Au, and Ag. A magnetization direction of the second magnetic layer and a magnetization direction of the third magnetic layer can be fixed to be opposite to each other.

A manufacturing method of a magnetic tunnel junction device according to another exemplary embodiment of the present invention includes: i) providing a first magnetic layer; ii) providing a nonmagnetic layer on the first magnetic layer; iii) providing a second magnetic layer on the nonmagnetic layer; iv) providing an oxidation-preventing layer on the second magnetic layer; v) performing in-situ annealing in vacuum on the first magnetic layer, the nonmagnetic layer, the second magnetic layer, and the oxidation-preventing layer; vi) providing a third magnetic layer on the oxidation-preventing layer; and vii) providing an antiferromagnetic layer on the third magnetic layer.

A manufacturing method of a magnetic tunnel junction device according to another exemplary embodiment of the present invention includes: i) providing a first magnetic layer; ii) providing a nonmagnetic layer on the first magnetic layer; iii) providing a second magnetic layer on the nonmagnetic layer; iv) providing an oxidation-preventing layer on the second magnetic layer; v) performing in-situ annealing in vacuum on the first magnetic layer, the nonmagnetic layer, the second magnetic layer, and the oxidation-preventing layer; vi) providing an exchange coupling layer on the oxidation-preventing layer; vii) providing a third magnetic layer on the exchange coupling layer; and viii) providing an antiferromagnetic layer on the third magnetic layer.

The manufacturing method may further include applying a magnetic field while performing the final annealing on each layer. When the magnetic field is applied while annealing each layer, the magnetization direction of the second magnetic layer and the magnetization direction of the third magnetic layer may be fixed. The temperature of the final annealing may be lower than the annealing temperature of the in-situ annealing in vacuum.

The annealing temperature of the in-situ annealing in vacuum may be 250° C. to 600° C. During the in-situ annealing in vacuum, the first and second magnetic layers can be tranformed to a body-centered cubic lattice structure. In the providing of the first magnetic layer, the first magnetic layer may include an amorphous material, and, in the providing of the second magnetic layer on the nonmagnetic layer, the second magnetic layer may include an amorphous material.

The diffusion of an element (e.g., Mn) can deteriorates the properties of the magnetic tunnel junction device. Performing an in-situ annealing during the deposition of the magnetic tunnel junction stack can prevent such detrimental diffusions. In addition, the epitaxy between the magnetic layer and the tunnel barrier layer can be improved during the annealing process. The restriction on the annealing temperature of the magnetic tunnel junction device can be alleviated. Further, a high-temperature annealing process required for obtaining a high tunnel magnetoresistance is separated from a low-temperature annealing process for achieving the exchange bias so that the tunneling magnetoresistance ratio of the magnetic tunnel junction device can be increased, and the exchange coupling of the magnetic tunnel junction device can be obtained.

DETAILED DESCRIPTION OF THE EMBODIMENTS

Figure 1:
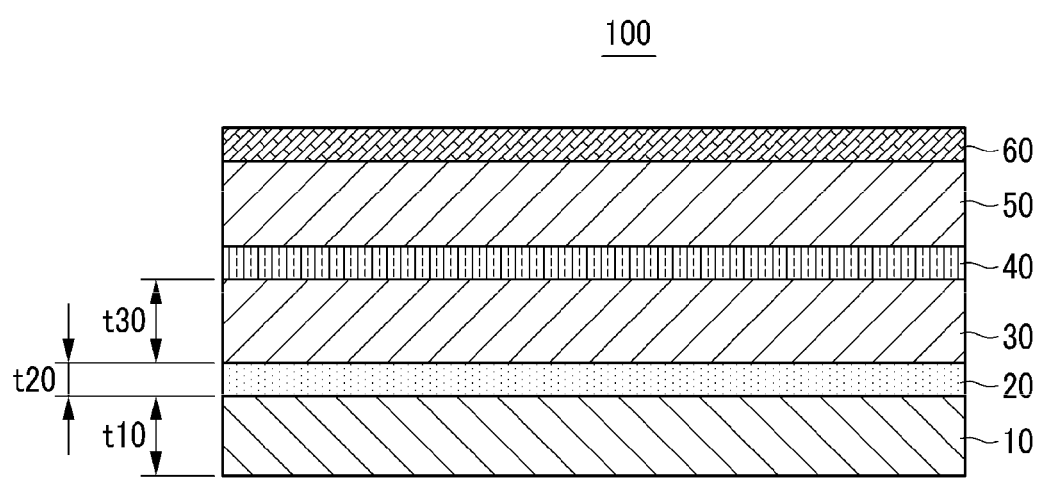
FIG. 1 schematically shows a magnetic tunnel junction device according to a first exemplary embodiment of the present invention.

It will be understood that when an element is referred to as being "on" another element, it can be directly on another element or intervening elements may be present therebetween. In contrast, when an element is referred to as being "directly on" another element, there are no intervening elements therebetween.

It will be understood that, although the terms first, second, third, etc. may be used herein to describe various elements, components, regions, layers, and/or sections, they are not limited thereto. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

Terminologies used herein are provided to merely mention specific exemplary embodiments and are not intended to limit the present invention. Singular expressions used herein include plurals unless they have definitely opposite meanings. The meaning of "including" used in this specification gives shape to specific characteristics, regions, positive numbers, steps, operations, elements, and/or components, and do not exclude the existence or addition of other specific characteristics, regions, positive numbers, steps, operations, elements, components, and/or groups.

Spatially relative terms, such as "below" and "above" and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the drawings. For example, if the device in the figures is turned over, elements described as "below" other elements or features would then be oriented "above" the other elements or features. Thus, the exemplary term "below" can encompass both an orientation of above and below. Apparatuses may be otherwise rotated 90 degrees or at other angles, and the spatially relative descriptors used herein are then interpreted accordingly.

All the terminologies including technical terms and scientific terms used herein have the same meanings that those skilled in the art generally understandTerms defined in dictionaries are construed to have meanings corresponding to related technical documents and the present description, and they are not construed as ideal or very official meanings, if not defined.

Exemplary embodiments of the present invention described with reference to cross-sectional views represent ideal exemplary embodiments of the present invention in detail. Therefore, various modification of diagrams, for example, modifications of manufacturing methods and/or specifications, are expected. Accordingly, exemplary embodiments are not limited to specific shapes of shown regions, and for example, also include modifications of the shape by manufacturing. For example, regions shown or described as flat may generally have rough or rough and nonlinear characteristics. Further, portions shown to have sharp angles may be rounded. Therefore, the regions shown in the drawings are basically just schematic and the shapes thereof are not intended to show the exact shapes of the region and are also not intended to reduce the scope of the present invention.

FIG. 1 schematically shows a cross-sectional structure of a magnetic tunnel junction device 100 according to a first exemplary embodiment of the present invention. The cross-sectional structure of the magnetic tunnel junction device 100 shown in FIG. 1 is an example of the present invention, and the present invention is not limited thereto. That is, the cross-sectional structure of the magnetic tunnel junction device 100 can be modified to various shapes.

As shown in FIG. 1, the magnetic tunnel junction device 100 includes a first magnetic layer 10, a nonmagnetic layer 20, a second magnetic layer 30, an oxidation-preventing layer 40, a third magnetic layer 50, and an antiferromagnetic layer 60. The magnetic tunnel junction device 100 may further include other layers as necessary.

The first magnetic layer 10 is separated from the second magnetic layer 30 by the nonmagnetic layer 20. That is, the second magnetic layer 30 is deposited on the nonmagnetic layer 20 deposited on the first magnetic layer 10. The first magnetic layer 10 has a switchable magnetization direction. That is, the first magnetic layer 10 functions as a free magnetization layer. Therefore, the magnetization direction of the first magnetic layer 10 can be switched by applying a magnetic field thereto. The resistance value thereof is changed according to relative magnetization directions of the first and second magnetic layers 10 and 30. For example, when the magnetization directions of the first and second magnetic layers 10 and 30 are parallel with each other, the resistance value of the magnetic tunnel junction device 100 is low. Here, the low resistance value may correspond a digital information, "0". In contrast, when the magnetization directions of the first and second magnetic layers 10 and 30 are antiparallel with each other, the resistance value of the magnetic tunnel junction device 100 is high. Here, the high resistance value may correspond digital information, "1".

As described above, the magnetization direction of the second magnetic layer 30 is fixed so as to drive the magnetic tunnel junction device 100 by controlling the magnetization direction. The fixed magnetization direction of the second magnetic layer 30 is not easily changed by a magnetic field. Therefore, although a magnetic field that is greater than a coercive force of the first magnetic layer 10 is applied to the second magnetic layer 30, the magnetization direction of the first magnetic layer 10 is switched, but the magnetization direction of the second magnetic layer 30 is not switched. By using this mechanism, the magnetic tunnel junction device 100 can be operated.

As shown in FIG. 1, a thickness t10 of the first magnetic layer 10 or a thickness t30 of the second magnetic layer 30 may be 1 nm to 5 nm. When the thickness t10 of the first magnetic layer 10 or the thickness t30 of the second magnetic layer 30 is too small, the spin polarization cannot be sufficiently obtained. In contrast, when the thickness t10 of the first magnetic layer 10 or the thickness t30 of the second magnetic layer 30 is too large, the current induced magnetization reversal effect is reduced. Accordingly, the thickness t10 of the first magnetic layer 10 or the thickness t30 of the second magnetic layer 30 is set within the above-stated range.

As shown in FIG. 1, the nonmagnetic layer 20 is deposited on the first magnetic layer 10. The nonmagnetic layer 20 functions as a tunnel barrier. A thickness t20 of the nonmagnetic layer 20 may be 0.7 nm to 2 nm. When the thickness t20 of the nonmagnetic layer 20 is too small, the spin filtering effect of the nonmagnetic layer 20 is decreased so that the magnetoresistance ratio is decreased. In addition, pinholes might be created in the nonmagnetic layer 20 so that a current leakage may occur. In contrast, when the thickness t20 of the nonmagnetic layer 20 is too large, a product of resistance and area (i.e., RA product) is too large so that the voltage for driving the magnetic tunnel junction device 100 becomes too high. Therefore, the thickness t2 of the nonmagnetic layer 20 is set to the above-stated range.

As shown in FIG. 1, the oxidation-preventing layer 40 is deposited on the second magnetic layer 30. The second magnetic layer 30 may be oxidized during the annealing of the magnetic tunnel junction device 100. Thus, the oxidation of the second magnetic layer 30 is prevented by using the oxidation-preventing layer 40.

The third magnetic layer 50 is deposited on the oxidation-preventing layer 40. The third magnetic layer 50 fixes the magnetization direction of the second magnetic layer 30 by magnetic coupling with the second magnetic layer 30. Here, a magnetization direction of the third magnetic layer 50 is the same as that of the second magnetic layer 30.

The antiferromagnetic layer 60 is deposited on the third magnetic layer 50 and thus forms a direct exchange bias structure. The antiferromagnetic layer 60 fixes the magnetization direction of the third magnetic layer 50 through the exchange coupling with the third magnetic layer 50. As a result, a magnetic field required switching of the third magnetic layer 50 is greatly increased to one direction by the antiferromagnetic layer 60. That is, the antiferromagnetic layer 60 fixes a magnetization direction of an adjacent third magnetic layer 50. Hereinafter, a manufacturing method of the magnetic tunnel junction device 100 of FIG. 1 will be described with reference to FIG. 2.

Figure 2:
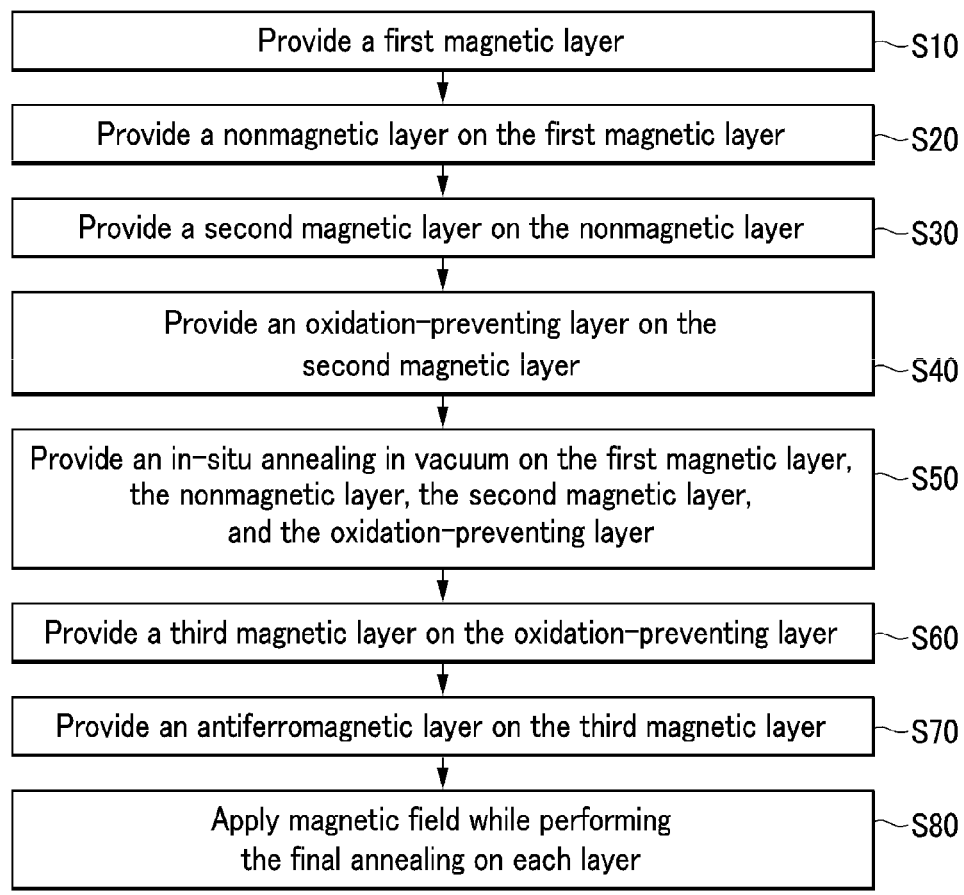
FIG. 2 schematically shows a flowchart of a manufacturing method of the magnetic tunnel junction device of FIG. 1.

FIG. 2 schematically shows a flowchart of the manufacturing method of the magnetic tunnel junction device 100 of FIG. 1. However, the present invention is not limited to the manufacturing method of the magnetic tunnel junction device 100 of FIG. 2. Therefore, the manufacturing method of the magnetic tunnel junction device 100 can be variously modified.

As shown in FIG. 2, the manufacturing method of the magnetic tunnel junction device 100 of FIG. 1 includes i) providing a first magnetic layer 10 (S10), ii) providing a nonmagnetic layer 20 on the first magnetic layer 10 (S20), iii) providing a second magnetic layer 30 on the nonmagnetic layer 20 (S30), iv) providing an oxidation-preventing layer 40 on the second magnetic layer 30 (S40), v) performing annealing on the first magnetic layer 10, the nonmagnetic layer 20, the second magnetic layer 30, and the oxidation-preventing layer 50 (S50), vi) providing a third magnetic layer 50 on the oxidation-preventing layer 40 (S60), and vii) providing an antiferromagnetic layer 60 on the third magnetic layer 50 (S70). The manufacturing method of the magnetic tunnel junction device 100 may further include other steps as necessary.

In the step S10, the first magnetic layer 10 is provided. A material of the first magnetic layer 10 may include a compound of a material selected from a group consisting of Fe, Co, Ni, FeCo, CoNi, and NiFe, and a material selected from a group consisting of B, Re, Rh, Cr, Cu, Gd, and Tb. For example, the first magnetic layer 10 may be a compound of FeX, CoX, NiX, FeCoX, CoNiX, or NiFeX. Here, X is B, Re, Rh, Cr, Cu, Gd, or Tb. The first magnetic layer 10 includes an amorphous material.

In the step S20, the nonmagnetic layer 20 is provided on the first magnetic layer 10. The nonmagnetic layer 20 may be deposited on the first magnetic layer 10. The nonmagnetic layer 20 includes an insulator or a semiconductor. Here, the insulator may include a compound of MgO, $Al_2O_3$, $HfO_2$, $TiO_2$, $Y_2O_3$, or $Yb_2O_3$.

Preferably, the insulator may include an MgO compound. In this case, the magnetoresistance ratio of the magnetic tunnel junction device 100 can be increased by coherent tunneling. This is because the crystal orientation of MgO is epitaxial to that of the first and second magnetic layers 10 and 30 that are adjacent thereto so that a wave function having a specific symmetry (i.e., $\Delta_1$ symmetry) can selectively pass the MgO barrier. Therefore, the magnetoresistance ratio of the magnetic tunnel junction device 100 can be increased only when the first and second magnetic layers 10 and 30 have a specific crystal orientation.

In the step S30, the second magnetic layer 30 is provided on the nonmagnetic layer. The second magnetic layer 30 may be deposited on the nonmagnetic layer 20. The material of the second magnetic layer 30 may include a compound of a material selected from a group consisting of Fe, Co, Ni, FeCo, CoNi, and NiFe, and a material selected from a group consisting of B, Re, Rh, Cr, Cu, Gd, and Tb. For example, the second magnetic layer 30 may be a compound of FeX, CoX, NiX, FeCoX, CoNiX, or NiFeX. Here, X is B, Re, Rh, Cr, Cu, Gd, or Tb. The second magnetic layer 30 includes an amorphous material.

In the step S40, the oxidation-preventing layer 40 is provided on the second magnetic layer 30. The oxidation-preventing layer 40 may be deposited on the second magnetic layer 30. The oxidation-preventing layer 40 may include a material having a high melting point, a low diffusion coefficient, and that maintains an amorphous phase without being crystallized during in-situ annealing in vacuum. In order to satisfy the conditions, the oxidation-preventing layer 40 may include Ru, Ta, Cr, V, Rh, Ir, Re, Mo, Os, or Pt.

In the step S50, the first magnetic layer 10, the nonmagnetic layer 20, the second magnetic layer 30, and the oxidation-preventing layer 40 are annealed in vacuum. That is, the annealing is performed before the antiferromagnetic material is formed. In this case, the annealing temperature may be 250° C. to 600° C. When the annealing temperature is too low, the grain-to grain epitaxy between the first magnetic layer, 10, the nonmagnetic layer 20, and the second magnetic layer 30 cannot be achieved. In contrast, when the annealing temperature is too high, the diffusion of detrimental elements may occur in each layer forming the magnetic tunnel junction device so that the magnetoresistance ratio may be decreased or the characteristics of the magnetic tunnel junction device may be deteriorated. The magnetic tunnel junction device 100 with a high magnetoresistance ratio can be manufactured by annealing the first magnetic layer 10, the nonmagnetic layer 20, the second magnetic layer 30, and the oxidation-preventing layer 40 within the above-stated temperature range.

By the annealing in the step S50, the first and second magnetic layers 10 and 30 respectively loose elements B so that the amorphous structure is changed to a crystal structure. For example, when the first and second magnetic layers 10 and 30 with an amorphous structure including CoFeB are annealed, the element B is lost from CoFeB. In this case, the first magnetic layer 10 and the second magnetic layer 30 are changed from the crystal structure to a body-centered cubic lattice structure. The body-centered cubic lattice structure of the first and second magnetic layers 10 and 30 is epitaxial to the lattice structure of the nonmagnetic layer 20. Particularly, when the nonmagnetic layer 20 includes MgO, the crystal structure of the first and second magnetic layers 10 and 30 is epitaxial to that of the nonmagnetic layer 20. Accordingly, the epitaxy between the first magnetic layer 10, the nonmagnetic layer 20, and the second magnetic layer 30 is achieved.

Meanwhile, because a material from antiferromagnet (e.g., Mn) that deteriorates the magnetoresistance ratio of the magnetic tunnel junction device 100 has not yet been deposited, the diffusion of the material that deteriorates the magnetoresistance ratio of the magnetic tunnel junction device 100 can be prevented in principle. Therefore, the magnetic tunnel junction device 100 having a high magnetoresistance ratio can be fabricated. In contrast, when an antiferromagnetic material including Mn is formed, the annealing cannot be performed at a high temperature due to the diffusion of Mn.

The oxidation-preventing layer 40 maintains the amorphous structure at the high annealing temperature of the step S40 and has a small diffusion coefficient so that it does not destroy the body-centered cubic lattice structure of the second magnetic layer 30. However, it is preferred to minimize the thickness of the oxidation-preventing layer 40 in order to prevent diffusion of a material included in the oxidation-preventing layer 40 to the second magnetic layer 30.

In the step S50, the third magnetic layer 50 is provided on the oxidation-preventing layer 40. The third magnetic layer 50 may be deposited on the oxidation-preventing layer 40. The third magnetic layer 50 includes Fe, Co, Ni, FeCo, CoNi, or NiFe. The third magnetic layer 50 may further include a compound of B, Re, Rh, Cr, Cu, Gd, or Tb in addition to the above-stated material. For example, the compound may be FeX, CoX, NiX, FeCoX, CoNiX, or NiFeX. Here, X is B, Re, Rh, Cr, Cu, Gd, or Tb.

In the step S60, the antiferromagnetic layer 60 is provided on the third magnetic layer 50. The antiferromagnetic layer 60 may be deposited on the third magnetic layer 50. The antiferromagnetic layer 60 includes a compound of IrMn, PtMn, NiMn, or FeMn.

In the step S70, the annealing is finally performed on the above-described layers. In this case, the temperature of the final annealing is lower than the annealing temperature of the step S50. It is preferred to set the annealing temperature in the step S70 to be low so as to prevent the diffusion of unwanted materials. For example, the temperature of the final annealing may be 250° C. to 350° C. When the annealing temperature is too low, an exchange bias is not formed between the antiferromagnetic layer 60 containing Mn and the third magnetic layer 50. This temperature is called a blocking temperature. The blocking temperature is determined by the material, composition, and structure of the antiferromagnetic layer 60. In contrast, when the temperature of the final annealing is too high, the diffusion of materials (e.g., Mn and Ru) that cause a deterioration of magnetic tunnel junctions can be greatly increased.

In the step S70, a magnetic field may be applied while annealing the antiferromagnetic layer 60 above the Neél temperature. Next, the antiferromagnetic layer 60 may be cooled below the Neél temperature. In this case, the magnetic field of the antiferromagnetic layer 60 is fixed to a specific direction, and the antiferromagnetic layer 60 fixes the magnetization direction of the third magnetic layer 50. As a result, the magnetization direction of the second magnetic layer 30 is fixed by the third magnetic layer 50. That is, the magnetization direction of the third magnetic layer 50 and the magnetization of the second magnetic layer 30 can be fixed through the annealing in the step S70.

Figure 3:
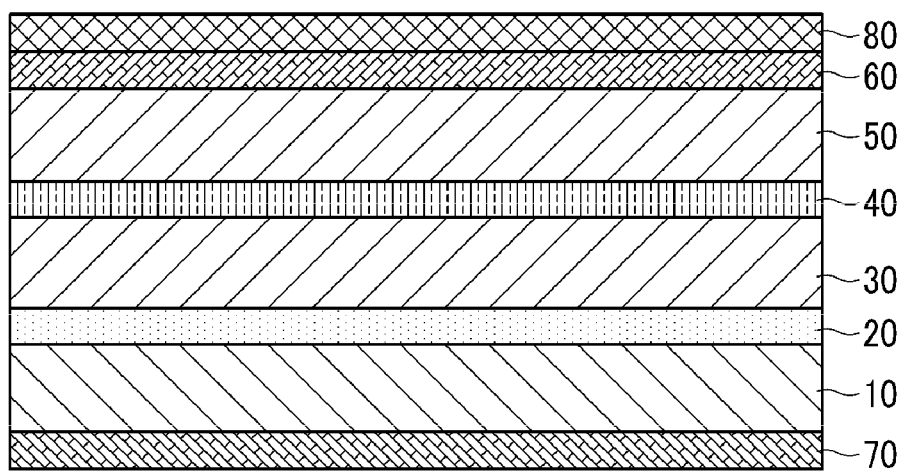
FIG. 3 schematically shows a magnetic tunnel junction device according to a second exemplary embodiment of the present invention.

FIG. 3 schematically shows a cross-sectional structure of a magnetic tunnel junction device 200 according to a second exemplary embodiment of the present invention. Excluding a buffer layer 70 and a protection layer 80, the magnetic tunnel junction device 200 of FIG. 3 is the same as the magnetic tunnel junction device 100 of FIG. 1, and therefore like reference numerals designate like elements and detailed descriptions thereof will be omitted.

The magnetic tunnel junction device 200 of FIG. 3 includes the buffer layer 70 and the protection layer 80, but the present invention is not limited thereto. That is, the magnetic tunnel junction device 200 may include one of the buffer layer 70 and the protection layer 80.

As shown in FIG. 3, the buffer layer 70 is provided under a first magnetic layer 10. The buffer layer 70 provides a smooth deposition of remaining layers when the magnetic tunnel junction device 200 is deposited on a substrate. The protection layer 80 is provided above an antiferromagnetic layer 60. The protection layer 80 externally protects the antiferromagnetic layer 60. The buffer layer 70 and the protection layer 80 can contain Au, Ru, Ta, Cu, CuN, Pd, Pt, or diamond-like carbon. The buffer layer 70 and the protection layer 80 may be formed by stacking the above-stated elements.

Figure 4:
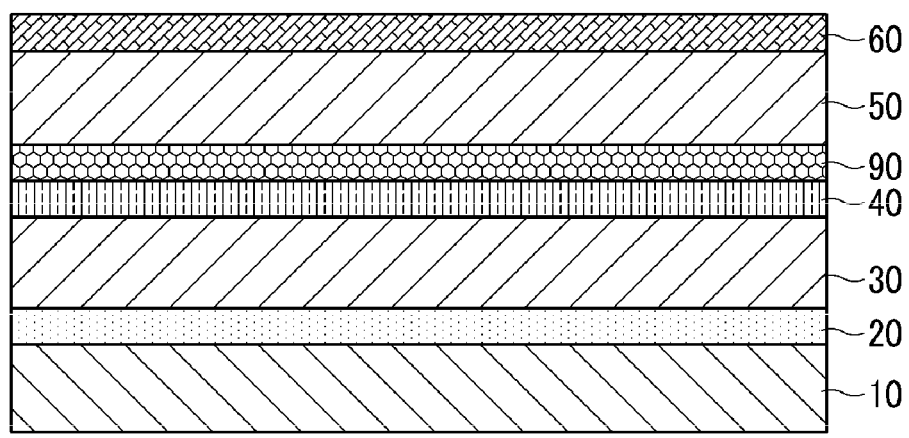
FIG. 4 schematically shows a cross-sectional view of a magnetic tunnel junction device according to a third exemplary embodiment of the present invention.

FIG. 4 schematically shows a cross-sectional structure of a magnetic tunnel junction device 300 according to a third exemplary embodiment of the present invention. Excluding an exchange coupling layer 90, the magnetic tunnel junction device 300 of FIG. 4 is the same as the magnetic tunnel junction device 100 of FIG. 1, and therefore like reference numerals designate like elements and detailed descriptions thereof will be omitted.

As shown in FIG. 4, the exchange coupling layer 90 is provided between an oxidation-preventing layer 40 and a third magnetic layer 50. The exchange coupling layer 90 provided between the second magnetic layer 30 and the third magnetic layer 50 forms a synthetic anti-ferromagnetic (SAF) structure, thereby inducing magnetic coupling of the second and third magnetic layers 30 and 50.

Free electrons inside the exchange coupling layer 90 exist in the form of a sine wave locked in the quantum well. The free electrons intermediate the exchange interaction between the second and third magnetic layers 30 and 50 such that magnetic coupling between the second and third magnetic layers 30 and 50 is induced through the exchange coupling layer 90. As a result, the third magnetic layer 50 forms anti-ferromagnetic alignment with the second magnetic layer 30. Accordingly, the magnetization direction of the second magnetic layer 30 is maintained opposite to that of the third magnetic layer 50.

Since the magnetization direction of the second magnetic layer 30 can be maintained opposite to that of the third magnetic layer 50, the effect of the magnetic field leakage to the first magnetic layer 10 can be minimized. In further detail, the antiferromagnetic coupling between the second and third magnetic layers 30 and 50 is superior to the exchange bias coupling between the first and second magnetic layers 10 and 30 in terms of thermal stability. Therefore, the magnetization direction of the second magnetic layer 30 and the magnetization direction of the third magnetic layer 50 can be stably fixed by pinning the magnetization direction of the second magnetic layer 30 and the magnetization direction of the third magnetic layer 50 to be anti-parallel with each other while restraining the third magnetic layer 50 with the antiferromagnetic layer 60.

The exchange coupling layer 90 may be formed on the oxidation-preventing layer 40 after in-situ annealing in vacuum of the step S50 of FIG. 2. The exchange coupling layer 90 includes Ru, Cr, V, Rh, Ir, Re, Mo, Cu, Os, Au, or Ag. The elements have strong exchange interaction so that magnetic coupling between the second and third magnetic layers 30 and 50 can be easily induced. The exchange coupling layer 90 is annealed in the step S70 of FIG. 2. Thus, the annealing for the magnetic tunnel junction is performed at a comparatively high temperature in the step S50 of FIG. 2, and the annealing for guaranteeing an exchange coupling bias is performed at a comparatively low temperature so that the magnetic tunnel junction device 300 having a good exchange coupling structure can be manufactured.

Hereinafter, the present invention will be described in further detail through experimental examples. However, the present invention is not limited to the experimental examples.

EXPERIMENTAL EXAMPLE 1

A magnetic tunnel junction device having a structure that is the same as that of the magnetic tunnel junction device of FIG. 3 was manufactured through sputtering and photolithography. A Ta/Ru/Ta buffer layer was formed on a thermally oxidized silicon substrate, and the first magnetic layer, a CoFeB thin film, was deposited on the buffer layer. MgO was used as a material of a nonmagnetic layer functioning as a tunnel barrier. A second magnetic layer, a CoFeB thin film, was deposited on the nonmagnetic layer. Ru was used as a material of an oxidation-preventing layer. A CoFe alloy was used as a material of a third magnetic layer, IrMn was used as a material of an antiferromagnetic layer, and a protection layer, Ta/Ru, was formed on the antiferromagnetic layer. In addition, a four terminal method was used to measure a magnetoresistance ratio of the magnetic tunnel junction device while changing the magnetic field applied to the sample.

Figure 5:
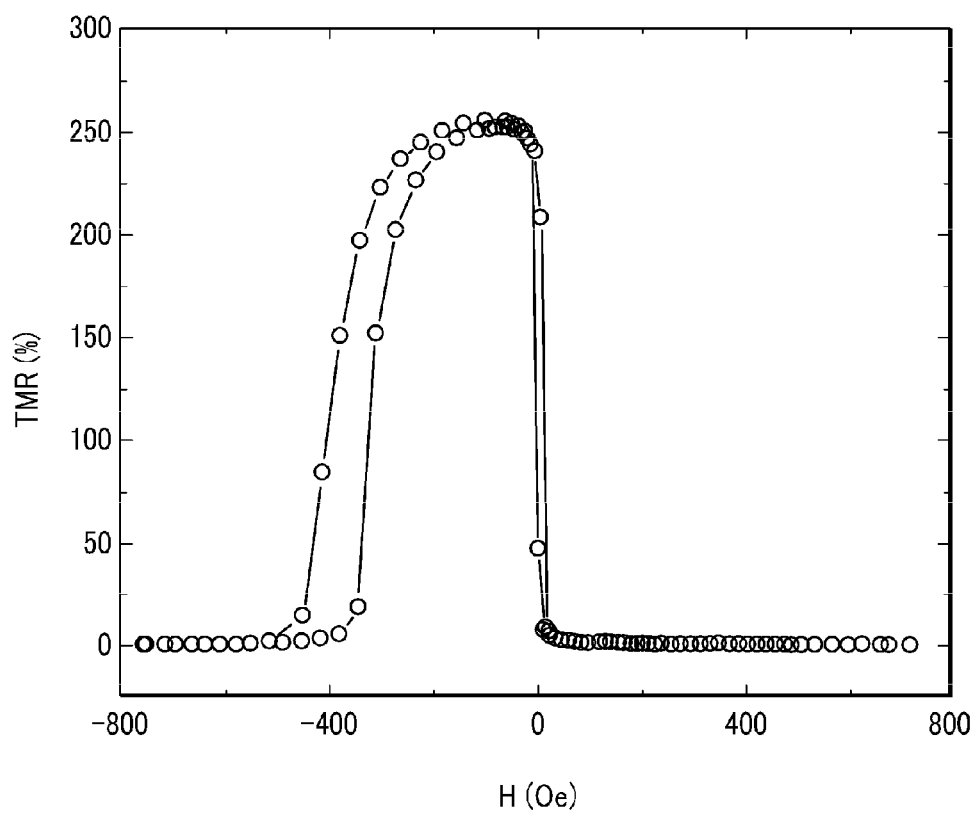
FIG. 5 is a graph illustrating a magnetoresistance ratio of a magnetic tunnel junction device manufactured according to Experimental Example 1.

FIG. 5 is a graph illustrating the magnetoresistance ratio of the magnetic tunnel junction device.

As shown in FIG. 5, the magnetic tunnel junction of the magnetic tunnel junction device had a good magnetoresistance ratio close to 250%. The first magnetic layer was switched close to 0 Oe, and the second magnetic layer was switched at about −400 Oe that was much greater than the coercivity of the first magnetic layer owing to the exchange bias having a negative value. Because the switching magnetic field of the second magnetic was approximately the same as the exchange bias, the strength of the exchange bias of the magnetic tunnel junction device was as good as about −400 Oe. Therefore, the magnetic tunnel junction device having a large magnetoresistance ratio and the stable exchange coupling could be fabricated through Experimental Example 1.

EXPERIMENTAL EXAMPLE 2

A magnetic tunnel junction device further including a buffer layer and a protection layer in addition to the magnetic tunnel junction device of FIG. 4 was fabricated by sputtering and photolithography. A Ta/Ru/Ta buffer layer was formed on a thermally oxidized silicon substrate, and the first magnetic layer, a CoFeB thin film, was deposited on the buffer layer. MgO was used as a material of a nonmagnetic layer functioning as a tunnel barrier. A second magnetic layer, a CoFeB thin film, was formed on the nonmagnetic layer. Ru was used as a material of an oxidation-preventing layer. Ru was also used as a material of an exchange coupling layer. A CoFe alloy was used as a material of a third magnetic layer, IrMn was used as a material of an antiferromagnetic layer, and a protection layer, Ta/Ru, was formed on the antiferromagnetic layer. In addition, a four terminal method was used to measure a magnetoresistance ratio of the magnetic tunnel junction device while changing a magnetic field applied to the sample.

Figure 6:
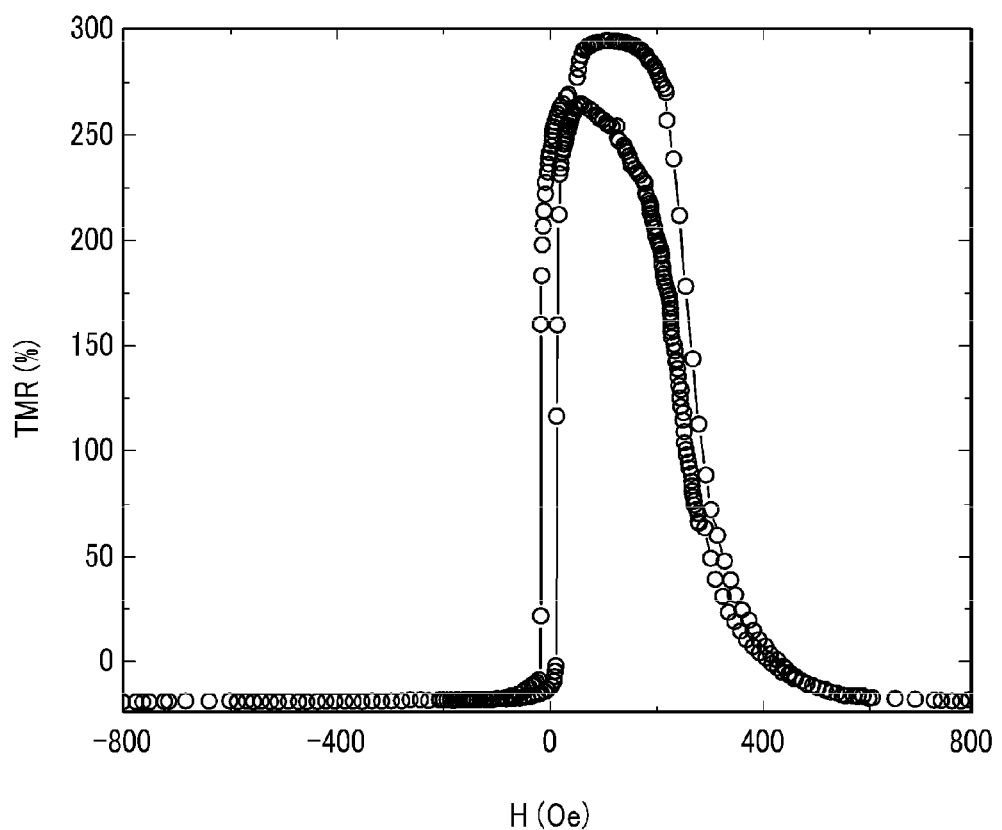
FIG. 6 is a graph illustrating a magnetoresistance ratio of a magnetic tunnel junction device manufactured according to Experimental Example 2.

FIG. 6 is a graph illustrating the magnetoresistance ratio of the magnetic tunnel junction device.

As shown in FIG. 6, the magnetic tunnel junction of the magnetic tunnel junction device had a good magnetoresistance ratio that was close to 300%. The first magnetic layer was switched at about 0 Oe, and the second magnetic layer was switched at about +280 Oe that was greater than the switching field of the first magnetic layer by an exchange bias having a positive value. Because the switching magnetic field of the second magnetic was approximately the same as the exchange bias, the strength of the exchange bias of the magnetic tunnel junction device was as good as about 280 Oe. Therefore, the magnetic tunnel junction device having a large magnetoresistance ratio and stable exchange coupling could be fabricated through Experimental Example 2.

Although this invention has been described in connection with what is presently considered to be practical exemplary embodiments, it is to be understood that the invention is not limited to the disclosed embodiments, but, in contrast, is intended to cover various modifications and equivalent arrangements included within the spirit and scope of the appended claims.

What is claimed is:

1. A manufacturing method of a magnetic tunnel junction device, comprising:
   providing a first magnetic layer;
   providing a nonmagnetic layer on the first magnetic layer;
   providing a second magnetic layer on the nonmagnetic layer;
   providing an oxidation-preventing layer on the second magnetic layer;
   performing in-situ annealing in vacuum on the first magnetic layer, the nonmagnetic layer, the second magnetic layer, and the oxidation-preventing layer;
   providing a third magnetic layer on the oxidation-preventing layer after the first magnetic layer, the nonmagnetic layer, the second magnetic layer and the oxidation-preventing layer have been subjected to the in situ anneal; and
   providing an antiferromagnetic layer on the third magnetic layer.

2. A manufacturing method of a magnetic tunnel junction device, comprising:
   providing a first magnetic layer;
   providing a nonmagnetic layer on the first magnetic layer;
   providing a second magnetic layer on the nonmagnetic layer;
   providing an oxidation-preventing layer on the second magnetic layer;
   performing in-situ annealing in vacuum on the first magnetic layer, the nonmagnetic layer, the second magnetic layer, and the oxidation-preventing layer;
   providing an exchange coupling layer on the oxidation-preventing layer after the first magnetic layer, the nonmagnetic layer, the second magnetic layer and the oxidation-preventing layer have been subjected to the in situ anneal;
   providing a third magnetic layer on the exchange coupling layer; and
   providing an antiferromagnetic layer on the third magnetic layer.

3. The manufacturing method of claim 1, further comprising applying a magnetic field while performing a final annealing after providing the antiferromagnetic layer, wherein, when the magnetic field is applied a magnetization direction of the second magnetic layer and a magnetization direction of the third magnetic layer are fixed.

4. The manufacturing method of claim 3, wherein the temperature of the final annealing is lower than the annealing temperature in the in-situ annealing in vacuum.

5. The manufacturing method of claim 1, wherein the annealing temperature of the in-situ annealing in vacuum is 250° C. to 600° C.

6. The manufacturing method of claim 5, wherein, in the performing of the in-situ annealing in vacuum, the first and second magnetic layers are changed to a body-centered cubic lattice structure.

7. The manufacturing method of claim 6, wherein, in the providing of the first magnetic layer, the first magnetic layer includes an amorphous material, and, in the providing of the second magnetic layer on the nonmagnetic layer, the second magnetic layer includes an amorphous material.

8. The manufacturing method of claim 2, further comprising applying a magnetic field while performing a final annealing after providing the antiferromagnetic layer, wherein, when the magnetic field is applied a magnetization direction of the second magnetic layer and a magnetization direction of the third magnetic layer are fixed.

9. The manufacturing method of claim 2, wherein the annealing temperature of the in-situ annealing in vacuum is 250° C. to 600° C.

* * * * *